United States Patent
Tanaka (10) Patent No.: US 6,407,619 B1
(45) Date of Patent: Jun. 18, 2002

(54) CHARGE PUMP CIRCUIT AND PLL CIRCUIT USING THE SAME

(75) Inventor: Toshiyuki Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/661,303

(22) Filed: Sep. 13, 2000

(30) Foreign Application Priority Data

Sep. 14, 1999 (JP) .......................................... 11-259950

(51) Int. Cl.$^7$ ............................................... H02J 19/82
(52) U.S. Cl. ...................... 327/536; 327/538; 327/541; 327/147; 323/313; 323/315; 363/59; 363/60
(58) Field of Search .............................. 327/536, 538, 327/540, 541, 543, 148, 157; 363/59, 60; 307/110; 323/314, 315, 316

(56) References Cited

U.S. PATENT DOCUMENTS

| | | | | |
|---|---|---|---|---|
| 4,814,726 A | * | 3/1989 | Byrd et al. ...................... | 327/7 |
| 5,357,216 A | * | 10/1994 | Nguyen ........................ | 331/17 |
| 5,473,283 A | * | 12/1995 | Luich .......................... | 327/157 |
| 5,663,686 A | * | 9/1997 | Tada ............................ | 331/17 |
| 5,767,736 A | * | 6/1998 | Lakshmikumar et al. ... | 327/536 |
| 6,037,811 A | * | 3/2000 | Ozguc .......................... | 327/108 |

FOREIGN PATENT DOCUMENTS

| | | |
|---|---|---|
| JP | 6-204864 | 7/1994 |
| JP | 7-177027 | 7/1995 |
| JP | 7-249985 | 9/1995 |
| JP | 10-13221 | 1/1998 |
| JP | 10-200395 | 7/1998 |

* cited by examiner

Primary Examiner—Kenneth B. Wells
Assistant Examiner—An T. Luu
(74) Attorney, Agent, or Firm—Young & Thompson (57) ABSTRACT

A charge pump circuit which can improve the C/N ratio of a PLL circuit and can prevent dead bands is provided. The charge pump circuit comprises a first current mirror circuit including a first reference current path and a first output current path, and a second current mirror circuit including a second reference current path and a second output current path. When this phase comparison signal showing a lagging phase is low, the first current mirror circuit puts a first output transistor provided within the first output current path in a cutoff state that is nearly turned on. On the other hand, when this phase comparison signal is high, the first current mirror circuit makes the first output transistor turn on immediately, thus the rise time of the charge pump current is shortened. When this phase comparison signal showing a leading phase is low, the second current mirror circuit puts a second output transistor provided within the second output current path in a cutoff state that is nearly turned on. On the other hand, when this phase comparison signal is high, the second current mirror circuit makes the second output transistor turn on immediately, thus the rise time of the charge pump current is shortened.

12 Claims, 7 Drawing Sheets

CHARGE PUMP CIRCUIT AND PLL CIRCUIT USING THE SAME

BACKGROUND OF THE INVENTION

1. Field of the Invention

The present invention relates to a charge pump circuit and a phase-locked loop (hereinafter referred to as "PLL") circuit using the charge pump circuit, and in particular to measures against a dead band in the charge pump circuit, and to improvements in the C/N (Carrier/Noise) ratio in the PLL circuit which are required in connection with this measures.

This application is based on Japanese Patent Application No. Hei 11-259950, the contents of which are incorporated herein by reference.

2. Description of the Related Art

A PLL frequency synthesizer (hereinafter referred to as "PLL circuit") is an oscillator which outputs, based on a single reference frequency signal, an output signal having an arbitrary frequency in accordance with a frequency dividing ratio of a frequency divider, which is set to a desired value supplied from the outside of the PLL circuit, and PLL circuits are applied to various circuits. For a PLL circuit to function as an oscillator, it must have a superior C/N ratio, i.e., the ratio of the oscillation frequency signal (Carrier) to the noise.

Figure 7:
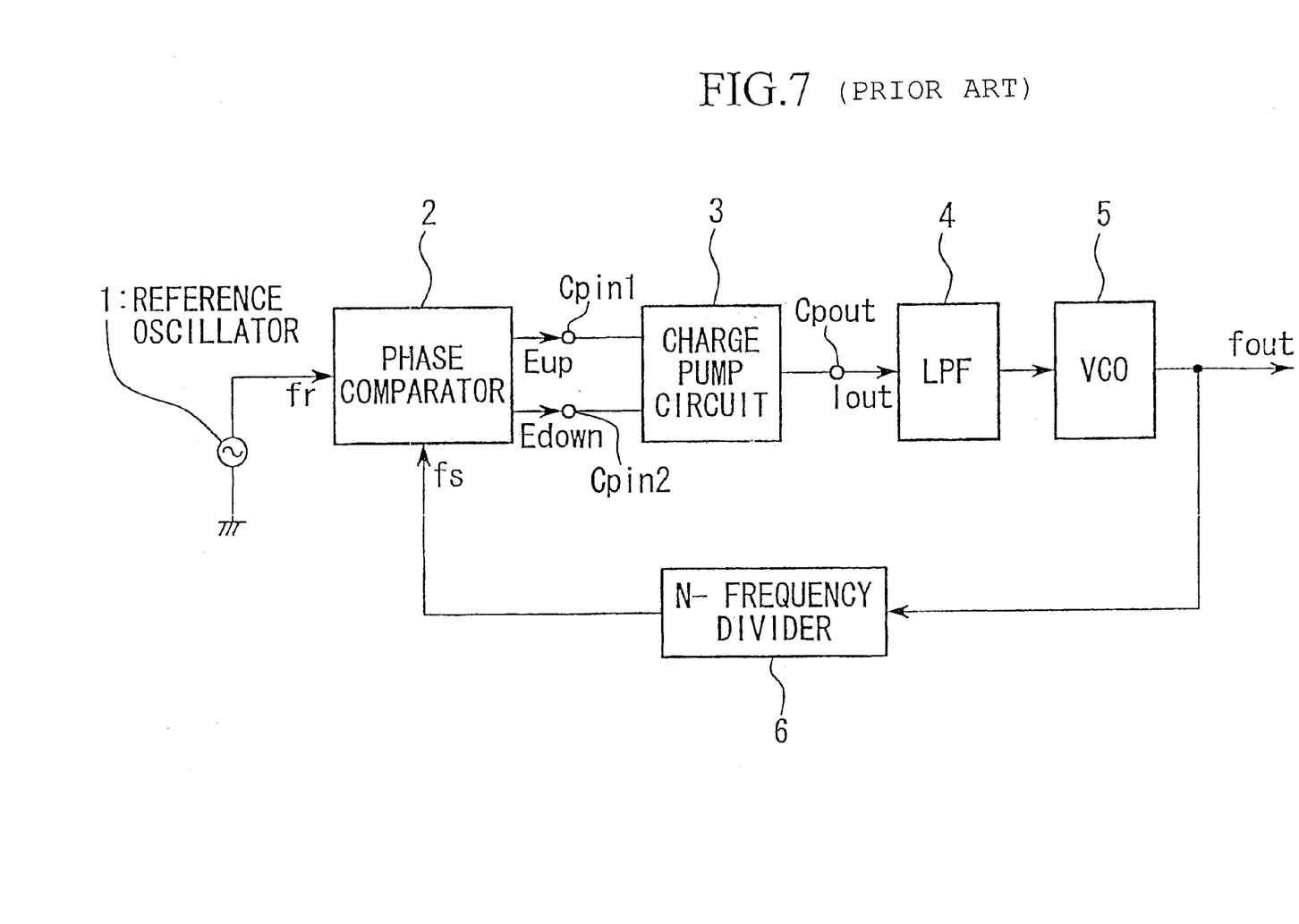
FIG. 7 is a block diagram showing the structure of a general PLL circuit.

FIG. 7 is a block diagram showing the structure of a general PLL circuit. This PLL circuit comprises a phase comparator 2, a charge pump circuit 3, a low pass filter (LPF) 4, a voltage controlled oscillator (VCO) 5, and an N-frequency divider 6. The phase comparator 2 receives the signal having a reference frequency $f_r$ from a reference oscillator 1, and compares the reference frequency $f_r$ with a divided frequency $f_s$, so as to calculate the phase difference between these frequencies. The charge pump circuit 3 outputs a charge pump current $I_{out}$ based on the comparison result output from the phase comparator 2. The LPF 4 eliminates the components of an alternating current from the charge pump current $I_{out}$. The VCO 5 outputs the oscillation signal having an output frequency $f_{out}$ based on the direct current voltage which is input from the LPF 4. The N-frequency divider 6 divides the frequency of the signal having the output frequency $f_{out}$ into 1/N, and outputs the divided signal having a divided frequency $f_s$. In addition, in the phase comparator 2, a signal having the reference frequency $f_r$ is supplied to a reference input terminal, and a signal having the divided frequency $f_s$ is supplied to a comparison input terminal. Thus, the PLL circuit outputs the signal having the output frequency $f_{out}$ as the output of the VCO 5, which is subjected to feedback control, in accordance with a frequency dividing ratio N for the N-frequency divider 6 supplied from the outside of the PLL circuit.

The phase comparator 2 outputs two signals as comparison result signals. In other words, the phase comparator 2 calculates the phase difference for the divided frequency $f_s$ with respect to the reference frequency $f_r$ as a standard, and if the phase difference indicates a lagging phase, the comparator makes a phase comparison signal Eup valid, while if the phase difference indicates a leading phase, the comparator makes a phase comparison signal Edown valid. The charge pump circuit 3 functions as a booster or a voltage dropper, and, based on the two comparison signals, supplies charge to the input of the LPF 4 or extracts charge from the input of the LPF 4. Some proposals have been made for techniques using such charge pump circuits, and one of these is disclosed, for example, in Japanese Unexamined Patent Application, First Publication, No. Hei 10-13221. In addition, charge pump circuits for PLL circuits where measures against a dead band are taken have also been proposed.

Figure 3:
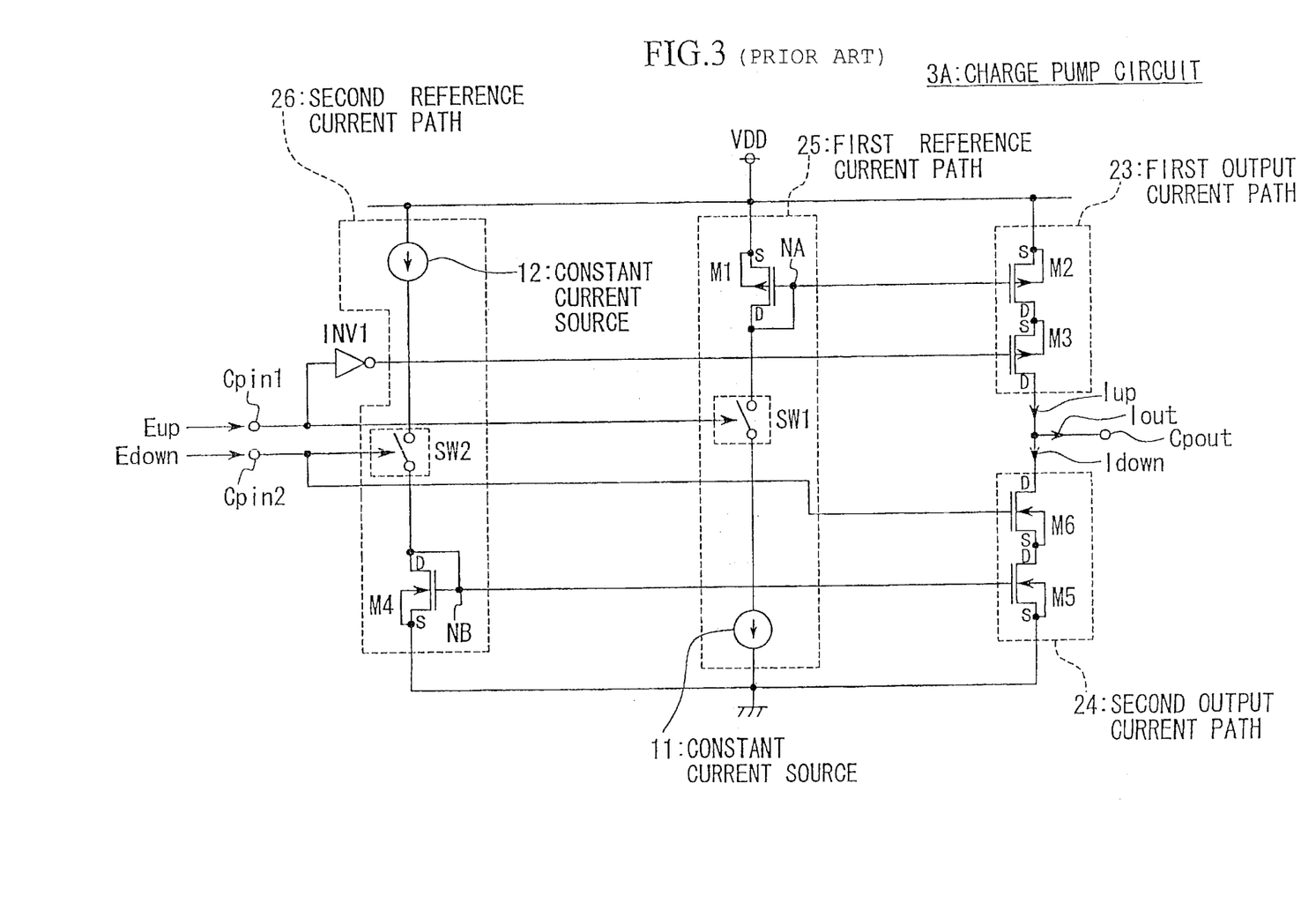
FIG. 3 is a circuit diagram showing the structure of a conventional charge pump circuit corresponding to a PLL circuit where the measures against a dead band are taken.

FIG. 3 is a circuit diagram showing the structure of a conventional charge pump circuit corresponding to a PLL circuit where measures against a dead band are taken. For example, in the PLL circuit shown in FIG. 7, when the phases of two signals which are input into the phase comparator 2 are the same, a period in which both phase comparison signals Eup and Edown are set to high (hereinafter referred to as "dead band prevention period") is provided as a measure against dead bands. A charge pump circuit 3A shown in FIG. 3 comprises first and second current mirror circuits. The first current mirror circuit comprises a first reference current path 25 which sets a node NA to a first reference potential in response to the phase comparison signal Eup, and a first output current path 23 which passes a charge-up current Iup in response to the first reference potential. On the other hand, the second current mirror circuit comprises a second reference current path 26 which sets a node NB to a third reference potential in response to the phase comparison signal Edown, and a second output current path 24 which passes a charge-down current Idown in response to the third reference potential.

When the phase comparison signal Eup is low, the first reference current path 25 sets the node NA to a predetermined high potential, so that the source-drain path in a p-type transistor M2 falls into a complete cutoff state, and the charge-up current Iup is set to zero. Moreover, when the phase comparison signal Eup is high, the first reference current path 25 sets the node NA to the first reference potential, so that the state of the source-drain path in the p-type transistor M2 changes from the complete cutoff state to a state in which a drain current of 6 mA flows. Consequently, the charge-up current Iup is set to 6 mA.

Next, the second reference current path 26 sets the node NB to a predetermined low potential when the phase comparison signal Edown is low, so that the source-drain path in an n-type transistor M5 falls into a complete cutoff state, and the charge down current Idown is set to zero. Moreover, the second reference current path 26 sets a node NB to the third reference potential when the phase comparison signal Edown is high, the state of the source-drain path in the n-type transistor M5 changes from a complete cutoff state to a state in which a drain current of 6 mA flows. Consequently, the charge down current Idown is set to 6 mA.

Figure 4A:
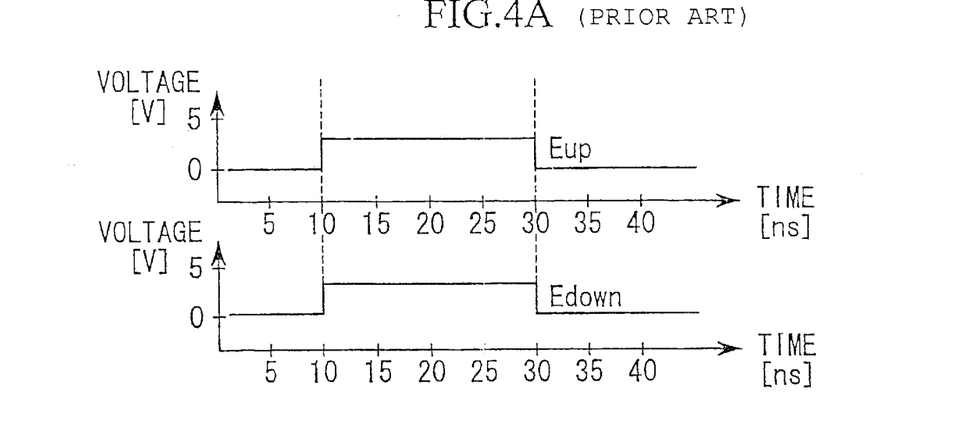
FIGS. 4A to 4C are timing charts which show the timing in the charge pump circuit shown in FIG. 3 obtained by the SPICE simulation.
Figure 4B:
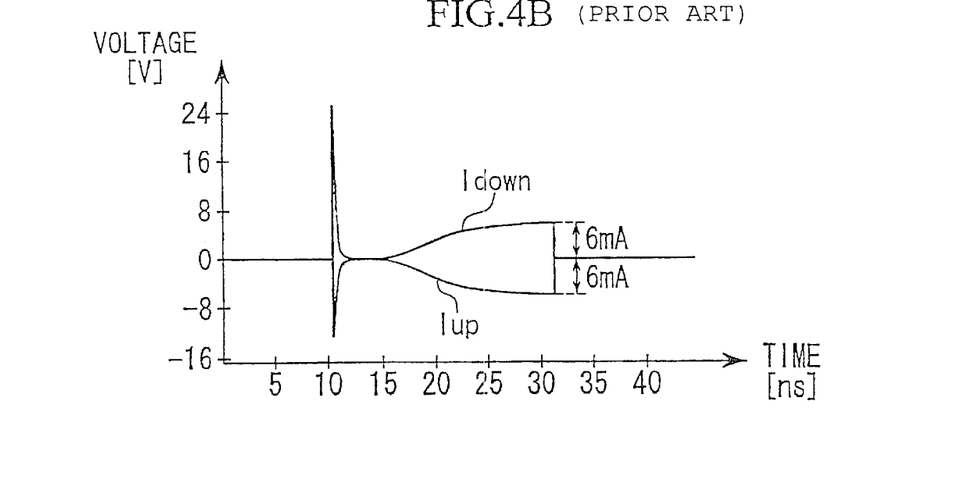
Figure 4C:
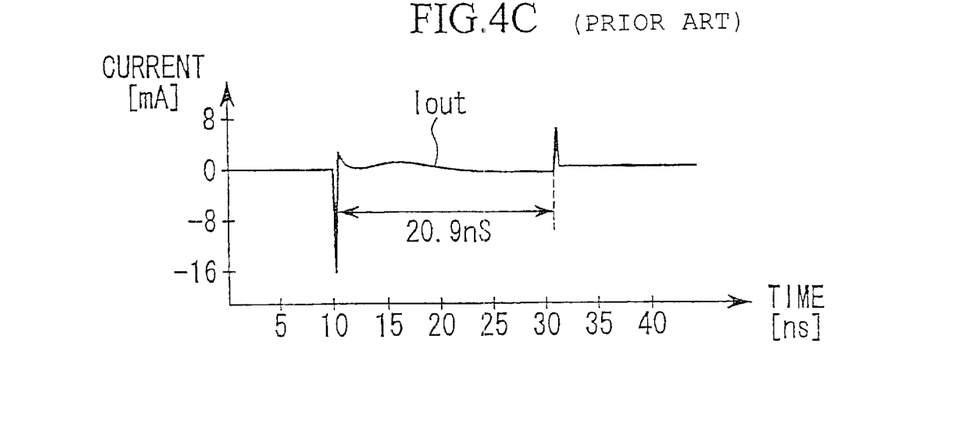

FIGS. 4A to 4C are timing charts showing the timing in the charge pump circuit shown in FIG. 3 where the results obtained by the simulation using the SPICE (Simulation Program with Integrated Circuit Emphasis) are shown. When the phase difference between the reference frequency signal $f_r$ and the divided frequency signal $f_s$ is approximately zero (hereinafter referred to as "in-phase timing"), the phase comparator 2 increases the levels of the phase comparison signals Eup and Edown to high. FIG. 4A is a timing chart showing the timing of the phase comparison signals Eup and Edown in which periods of time of 10 ns to 30 ns are set as dead band prevention periods. Moreover, FIG. 4B is a timing chart showing the timing of the charge-down current Idown and the charge-up current Iup. Furthermore, FIG. 4C is a timing chart showing the timing of the charge pump current $I_{out}$ which is the difference between the charge-up current Iup and the charge-down current Idown.

The rise time of the charge pump current in which each of the charge-up current Iup and the charge-down current Idown increases from 0 mA to 6 mA is 20.9 nanoseconds, and the switching of the current results in a noise current whose duration is equal to or below one nanosecond immediately after the change in the charge pump current $I_{out}$. In addition, it is necessary to extend the dead band prevention period in accordance with the increase in the rise time of the charge pump current $I_{out}$.

In the conventional technology as stated above, the period for the measures to prevent dead bands have to be long, so that the increase in noise accompanied by such a dead band prevention period causes the problem of a deterioration of the C/N ratio of the PLL circuit.

SUMMARY OF THE INVENTION

It is therefore an object of the present invention to provide a charge pump circuit which can obtain a short rise time of a charge pump current. Another object of the present invention is to provide a PLL circuit which can improve the C/N ratio which is required in connection with measures against dead bands in a charge pump circuit.

In order to attain the above objects, a charge pump circuit according to the present invention comprises a first current mirror circuit through which a charge-up current flows and a second current mirror circuit through which a charge-down current flows, and outputs a charge pump current corresponding to the difference between the charge-up current and the charge-down current. The first current mirror circuit comprises a first reference transistor which generates a first reference potential in response to the activation of a first comparison signal, and generates a second reference potential in response to the deactivation of the first comparison signal, and a first output transistor through which the charge-up current flows in response to the application of the first reference potential, while turning off in response to the application of the second reference potential. The second current mirror circuit comprises a second reference transistor which generates a third reference potential in response to the activation of a second comparison signal, and generates a fourth reference potential in response to the deactivation of the second comparison signal, and a second output transistor through which the charge-down current flows in response to the application of the third reference potential, while turning off in response to the application of the fourth reference potential.

According to the above-described structure, in response to the deactivation of the first comparison signal, the first current mirror circuit applies the second reference potential to the first output transistor output. For this reason, when the state of the first comparison signal changes from the deactivated state to the activated state, the first output transistor immediately changes from the state due to application of the second reference potential to the state due to application of the first reference potential. For this reason, the rise time of the charge-up current is reduced. Similarly, in response to the deactivation of the second comparison signal, the second current mirror circuit applies the fourth reference potential to the second output transistor beforehand. For this reason, when the second comparison signal changes from the deactivated state to the activated state, the second output transistor can immediately changes from the state due to application of the fourth reference potential to the state due to application of the third reference potential. For this reason, the rise time of the charge-down current is also shortened. As a result, the rise time of the charge pump current is shortened, thus the dead band prevention period can be shortened. Consequently, both low frequency noise and a switching noise are reduced, and the C/N ratio of the PLL circuit is also improved.

DETAILED DESCRIPTION OF THE PREFERRED EMBODIMENTS

Figure 5:
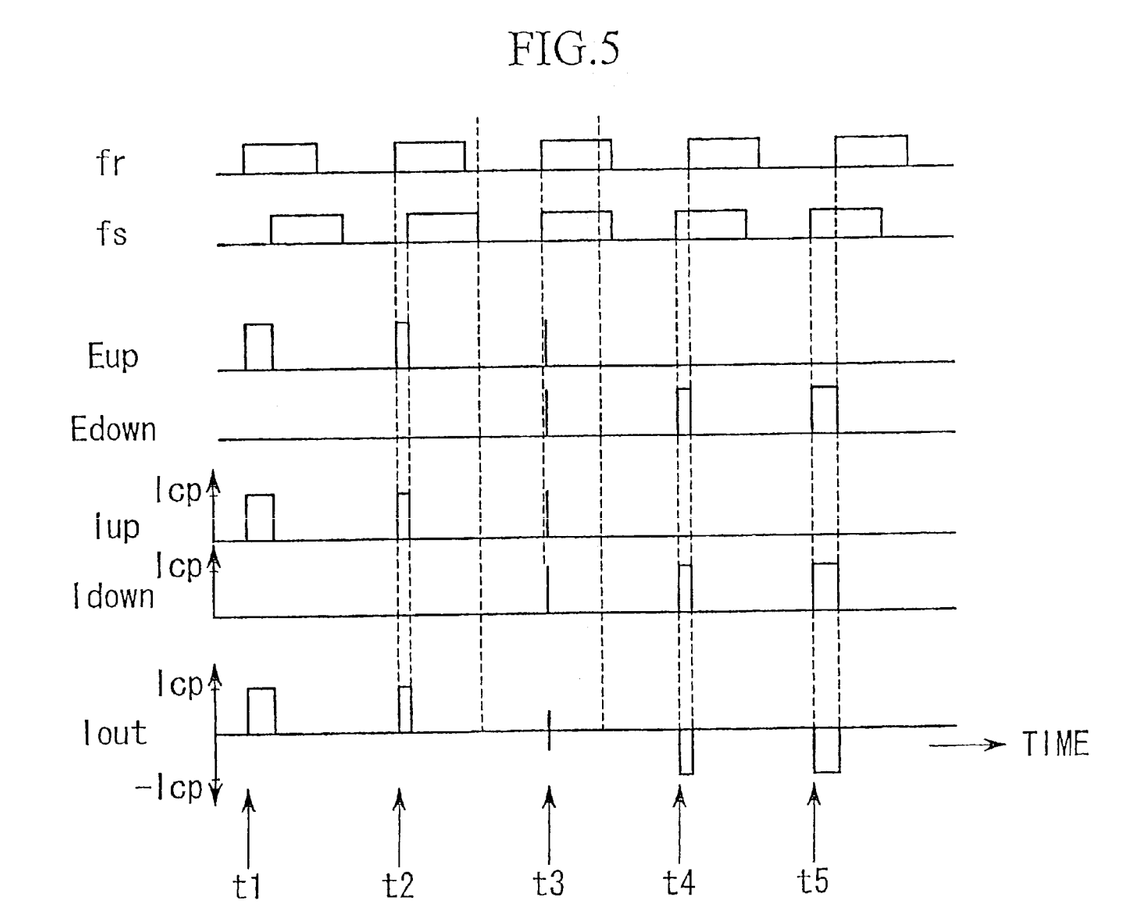
FIG. 5 is a timing chart showing the operation of a charge pump circuit in a PLL circuit in which no period for the prevention of dead bands is provided.

First, the reason for the generation of dead bands, the cause of the deterioration in the C/N ratio, and measures which can be taken against dead bands and the deterioration of the C/N ratio will be explained. FIG. 5 is a timing chart showing the operation of a charge pump circuit in a PLL circuit in which no period to prevent dead bands is provided. The phase comparator 2 calculates the phase difference for a divided frequency $f_s$ with respect to a reference frequency $f_r$ as a standard, and activates a phase comparison signal Eup at times t1 and t2 when the phase difference shows a lagging phase, while it activates a phase comparison signal Edown at times t4 and t5 when the phase difference shows a leading phase. When a dead band prevention period is inappropriately provided, a small phase difference, which is generated when the reference frequency $f_r$ and the divided frequency $f_s$, are in-phase at time t3, is difficult to detect. For this reason, a dead band in which the phase comparison signals Eup and Edown are incorrectly output occurs. That is, if there is a dead band, when the PLL circuit is locked because the phases of the reference frequency $f_r$ and the divided frequency $f_s$, are almost the same, a minute phase difference between the reference frequency $f_r$ and the divided frequency $f_s$, is difficult to detect. As a result, a state in which no charge pump current $I_{out}$, which is a controlled variable, is supplied to a VCO 5 is maintained, and the charging and discharging operations for an LPF 4 stop, so that the direct current voltage applied to the VCO 5 is maintained as it is. In this case, the adjustment operation of the controlled variable caused by the feedback function stops working in the PLL circuit, thus the state of oscillation becomes unstable and the C/N ratio in the output frequency $f_{out}$ is reduced.

On the other hand, it is probable to provide a period after time t3 in which the charge-up current Iup and the charge-down current Idown flow simultaneously so that dead bands do not occur. In this case, imbalances in the circuit, for example, differences in characteristics among p-type transistors and n-type transistors which are components of the charge pump circuit, cause a pulse-shaped switching noise immediately after time t3 due to the changes in the charge pump current $I_{out}$ at the rising and falling edges. The peak value or the average value of a switching noise current is unstable and slightly changes whenever a phase comparison is carried out, thus noise containing low frequency components which the LPF 4 cannot readily reduce will occur, thus the generated noise modulates the VCO 5 and decreases the C/N ratio of the output frequency fout.

Figure 6:
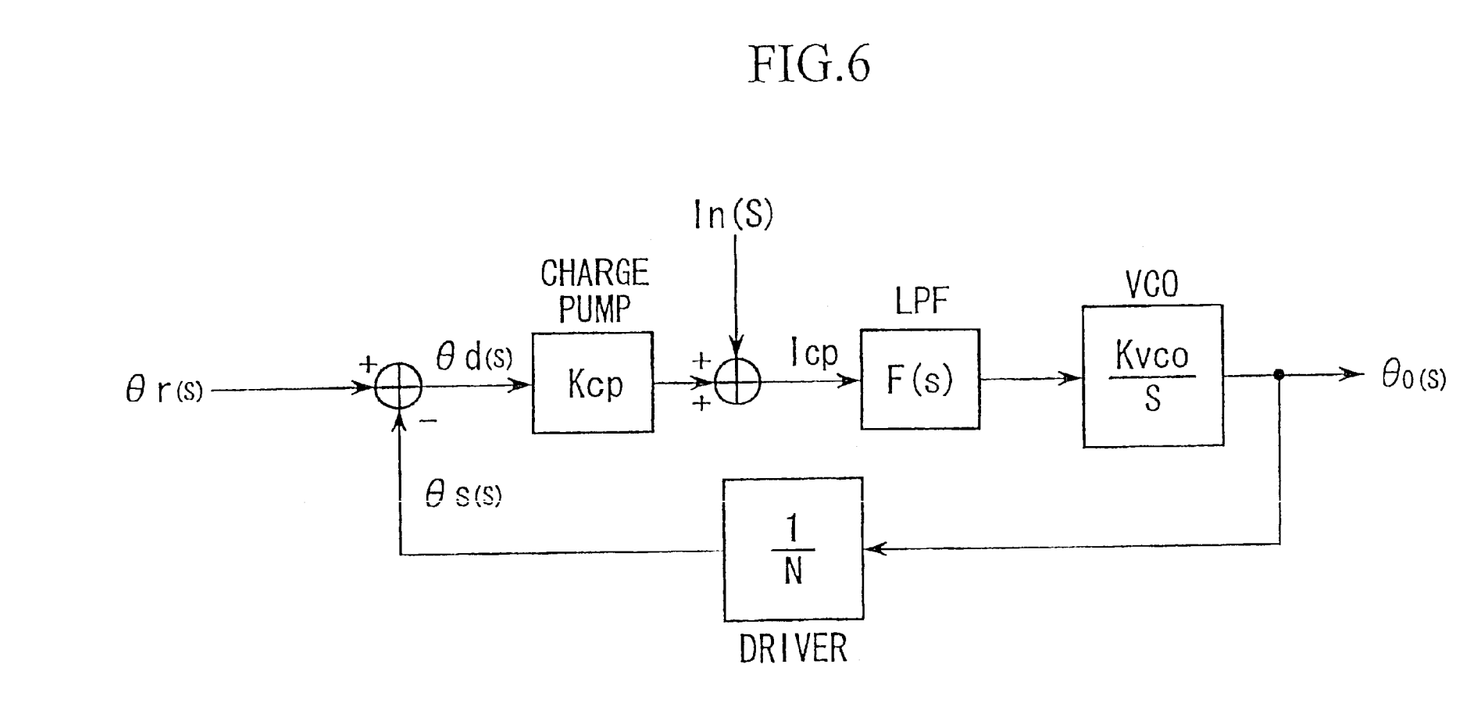
FIG. 6 is a block diagram showing the transfer function of a PLL circuit.

Next, FIG. 6 is a block diagram showing the transfer function of a PLL circuit. The PLL circuit comprises a charge pump element with a gain of Kcp, an LPF element with a transfer function F (s), a VCO element with a gain Kvco/s, and a driver element with a gain 1/N. Moreover, the noise In (s) occurring in the charge pump circuit 3 and the reference phase θr(s) are input into the PLL circuit. Furthermore, a signal with an output phase θo(s) is output from the PLL circuit. A difference signal θd(s) between the reference phase θr(s) and the divider phase θs(s) passes through the charge pump element, and adding the noise In (s) to the output of the charge pump element generates a sum signal Icp. The sum signal Icp passes through the LPF element and the VCO element, then the VCO element outputs the output phase θo(s), and a part of the output phase passes through the driver element so as to feed back the output phase to an input side as the divider phase θs(s).

Here, the transfer function Kn(s) of the PLL circuit shows the degree of the effect of the noise on the output component of the PLL circuit. When In (s) and θo(s) are considered as an input and an output, respectively, the transfer function Kn (s) can be expressed as the following Equation (1).

$$Kn(s)=\theta o(s)/In(s)=\{F(s)\times Kvco/s\}/[1+\{Kcp\times Kvco\times F(s)\}/\{s\times N\}] \quad (1)$$

Moreover, the gain Kcp of the charge pump element can be expressed as the following Equation (2).

$$Kcp=Icp/(2\pi)[A/rad] \quad (2)$$

The noise In (s) is a switching noise generated when in phase and has very little effect on the LPF, thus it is considered that F(s)≈1 and the relationship (Kcp×Kvco/N) >>1 is usually satisfied.

Taking Equation (2) and these conditions into consideration, Equation (1) can be approximated by the following Equation (3).

$$Kn(s)\approx N/Kcp=2\pi\times N/Icp \quad (3)$$

Equation (3) shows that the transfer function Kn (s) which shows the effect of noise on the PLL circuit is inversely proportional to the sum signal Icp, so that an increase in the sum signal Icp reduces the effect of the noise. However, the increase in the sum signal Icp means an increase in the current value of the charge-up current Iup and the charge-down current Idown in the charge pump circuit 3, thus the switching noise increases due to an increase in the current. Furthermore, concerning cutoff transistors M3 and M6, it is necessary to enlarge the gate widths W3 and W6 which control the channels of these transistors. For this reason, the charge pump current rises slowly due to an increase in gate capacitances in accordance with increase in the gate widths.

In a PLL circuit, it is necessary to extend the dead band prevention period as the charge pump current rises slowly, with the result that noise components such as a low frequency noise increase. Therefore, when reducing the effect of noise components on the PLL circuit, both the switching noise and low frequency noise increase, and the C/N ratio is reduced.

Figure 1:
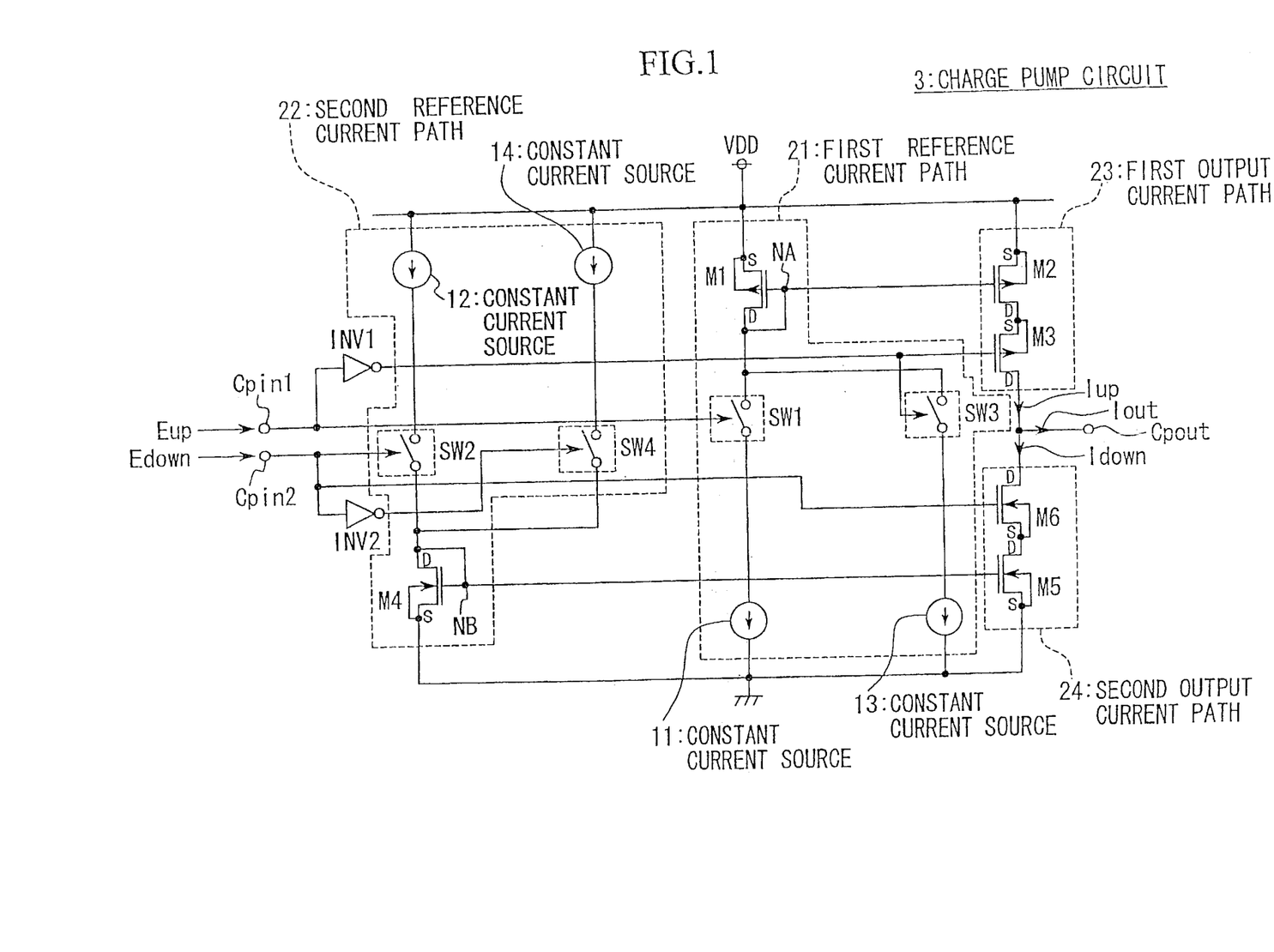
FIG. 1 is a circuit diagram showing the structure of a charge pump circuit according to an embodiment of the present invention.

Hereinafter, the charge pump circuit according to an embodiment of the present invention will be explained with reference to drawings. FIG. 1 is a circuit diagram showing the structure of the charge pump circuit according to the present embodiment of the present invention. A charge pump circuit 3 is provided with a first signal input terminal Cpin1 to which a phase comparison signal Eup is supplied, a second signal input terminal Cpin2 to which a phase comparison signal Edown is supplied, and a signal output terminal Cpout from which a charge pump current $I_{out}$ is output. Moreover, the charge pump circuit 3 comprises two current mirror circuits as described later. Furthermore, the charge pump circuit 3 comprises a first reference current path 21 and a second reference current path 22 which constitute the reference side in respective current mirror circuits, a first output current path 23 and a second output current path 24 which constitute the output side in respective current mirror circuits and are mutually connected in series, an inverter INV1 which outputs the inverted signal of the phase comparison signal Eup input, and the inverter INV2 which outputs the inverted signal of the phase comparison signal Edown input.

The first reference current path 21 comprises a p-type transistor M1, a first branch, and a second branch. The p-type transistor M1 is a reference side transistor whose gate and drain are connected to each other at the node NA, and whose source is connected to a power supply voltage VDD. The first branch comprises a series circuit in which a switch SW1 operating in response to the phase comparison signal Eup, and a constant current source 11 whose current value is set up based on the charge-up current Iup are connected in series. The second branch comprises a series circuit in which a switch SW3 which operates in response to the inverted signal of the phase comparison signal Eup and a constant current source 13 whose current value is set up so as to set a node NA to a third reference potential are connected in series. In addition, the first and second branches are connected in parallel between the node NA and the ground.

Next, the second reference current path 22 comprises an n-type transistor M4, a third branch, and a fourth branch. The n-type transistor M4 is a reference side transistor whose gate and drain are connected to each other at the node NB, and whose source is connected to the ground. The third branch comprises a series circuit in which a constant current source 12 whose current value is set up based on the charge-down current Idown and a switch SW2 which operates in response to the phase comparison signal Edown are connected in series. Moreover, the fourth branch comprises a series circuit in which a constant current source 14 whose current value is set up so as to set a node NB to a fourth reference potential and a switch SW4 which operates in response to the inverted signal of the phase comparison signal Edown are connected in series. In addition, the third and fourth branches are connected in parallel between the power supply voltage VDD and the node NB.

Next, the first output current path 23 comprises p-type transistors M2 and M3, and these transistors are connected in series and are arranged between the power supply voltage VDD and the signal output terminal Cpout in this order. Here, the p-type transistor M2 is an output side transistor whose gate is connected to the gate of the p-type transistor M1, and the p-type transistor M3 is a cutoff transistor in which the inverted signal of the phase comparison signal Eup is applied to its gate.

Next, the second output current path 24 comprises n-type transistors M5 and M6, and these transistors are connected in series and are arranged between the signal output terminal Cpout and the ground in this order. Here, the n-type transistor M6 is a cutoff transistor in which the phase comparison signal Edown is applied to its gate, and the n-type transistor M5 is an output side transistor whose gate is connected to the gate of the n-type transistor M4. In addition, the signal output terminal Cpout outputs the charge pump current $I_{out}$, which is equivalent to the difference between the charge-up current Iup and the charge-down current Idown.

In this way, the output transistors and the cutoff transistors are prepared separately, thus the output transistors control the current value, while the cutoff transistors control the switching of the current. For this reason, individual transistors share functions and the design flexibility of the transistors is extended.

The first reference current path 21 and the first output current path 23 function as a current mirror circuit with a current ratio of one to ten. Similarly, the second reference current path 22 and the second output current path 24 function as a current mirror circuit with a current ratio of one to ten. Moreover, a constant current of 0.6 mA passes through both the first reference current path 21 and the second reference current path 22, so that the respective current values of the constant current sources 11 and 12 are set to 0.6 mA.

Meanwhile, the characteristics of a MOS (Metal Oxide Semiconductor) transistor are determined by the ratio of the channel width W and the channel length L (hereinafter referred to as "channel constant W/L"). The drain current Ids in a saturation region can be expressed as the following Equation (4)

$$Ids = K \times W/L \times (Vgs - Vt)^2 \quad (4)$$

where K is a constant, Vgs is the voltage between the gate and the source, and Vt is the threshold voltage.

As is apparent from this equation, the drain current Ids passing through a MOS transistor is proportional to the channel constant W/L when the gate voltages are the same. Here, when integrating MOS transistors in an IC (Integrated Circuit) chip, it is desirable to make the occupancy size small, thus a narrow channel width W or a short channel length L is preferable.

As an example, in the present embodiment, the channel lengths L1, L2, L4, and L5 of the reference side transistors M1 and M4, and the output side transistors M2 and M5 are set to 1.5 micrometers as a predetermined length from the viewpoint of the controllability of current in order to control the current value passing through the source-drain paths. On the other hand, the channel lengths L3 and L6 of the cutoff transistors M3 and M6 are set to the minimum length of 0.28 micrometers allowed by the semiconductor manufacturing process from the viewpoint of size miniaturization so as to control the flow of the current passing through the source-drain paths.

Moreover, the channel widths W1 and W4 of the reference side transistors M1 and M4 are set to 210 micrometers so as to control the current value of 0.6 mA passing through the source-drain paths. On the other hand, the channel widths W2 and W5 of the output side transistors M2 and M5 are set to 2100 micrometers which is 10 times the channel width of the reference side transistors so as to control the current of 6 mA passing through the source-drain paths.

In addition, the channel widths W3 and W6 of the cutoff transistors M3 and M6 are set to 100 micrometers so as to control the flow of the current of 6 mA passing through the source-drain paths. Additionally, these values are designed so that the resistance of the p-type transistor M3 which is turned on does not affect the circuit's operation by simulating the channel width W3 under the conditions that the power supply voltage VDD is 2.7 V, the voltage at the signal output terminal Cpout of the charge pump circuit 3 is 2.4 V, and the threshold voltage Vt of the MOS transistor is the maximum (worst) value. Moreover, the designed value of the channel width W3 is applied similarly to the value of the channel width W6.

According to the above-mentioned structure, in the first reference current path 21, when the phase comparison signal Eup is low, switch SW3 turns on so that a current of 0.3 mA flows and the node NA is set to the second reference potential. The source-drain path in the p-type transistor M2 is set to a cutoff state that is nearly turned on due to the second reference potential. On the other hand, the source-drain path in the p-type transistor M3 is set to a cutoff state due to high potential applied to the gate. As a result of this, the first output current path 23 sets the charge-up current Iup, which passes through the path between the signal output terminal Cpout and the ground, to zero.

Next, when the phase comparison signal Eup is high, in the first reference current path 21, the switch SW1 turns on and a current of 0.6 mA flows, so that the node NA is set to the first reference potential. As a result, the source-drain path in the p-type transistor M2 changes due to the first reference potential from the previous cutoff state to the state in which the drain current of 6 mA flows. Moreover, the source-drain path in the p-type transistor M3 turns on due to low potential applied to the gate. Thus, the first output current path 23 allows the charge-up current Iup of 6 mA to flow between the signal output terminal Cpout and the ground. Here, when the phase comparison signal Eup is low, the state of the source-drain path in the p-type transistor M2 is set to a cutoff state that is nearly turned on. For this reason, if the level of the phase comparison signal Eup changes to high, the charge-up current Iup rises immediately so that the rise time of the charge pump current is shortened.

Next, when the phase comparison signal Edown is low, in the second reference current path 22, the switch SW4 turns on and a current of 0.3 mA flows, so that the node NB is set to the fourth reference potential. As a result, the source-drain path in the n-type transistor M5 is set to the cutoff state that is nearly turned on due to the fourth reference potential. Moreover, the source-drain path in the n-type transistor M6 is set to the cutoff state due to low potential applied to the gate. Thus, the second output current path 24 sets the charge-down current Idown, which passes through the path between the signal output terminal Cpout and the ground, to zero.

Next, when the phase comparison signal Edown is high, in the second reference current path 22, the switch SW2 turns on and a current of 0.6 mA flows, so that the node NB is set to the third reference potential. As a result, the state of the source-drain path in the n-type transistor M5 changes from the previous cutoff state to the state in which a drain current of 6 mA flows due to the third reference potential. The source-drain path in the n-type transistor M6 turns on according to high potential applied to the gate. Thus, the second output current path 24 sets the charge-down current Idown, which passes through the path between the signal output terminal Cpout and the ground, to 6 mA. Here, when the phase comparison signal Edown is low, the source-drain path in the n-type transistor M5 is the cutoff state that is nearly turned on in advance. For this reason, if the phase comparison signal Edown changes to high, the charge-down current Idown rises rapidly, so that the rise time of the charge pump current is shortened.

Figure 2A:
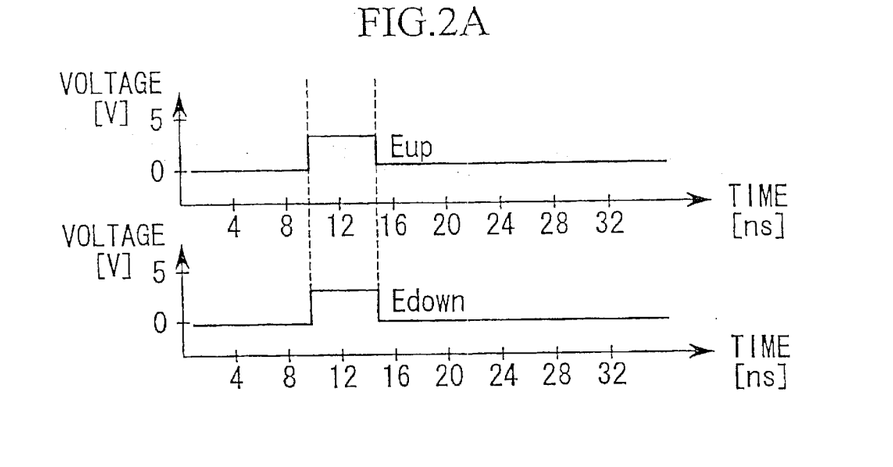
FIGS. 2A to 2C are timing charts which show the timing in the charge pump circuit shown in FIG. 1 obtained by the SPICE simulation.
Figure 2B:
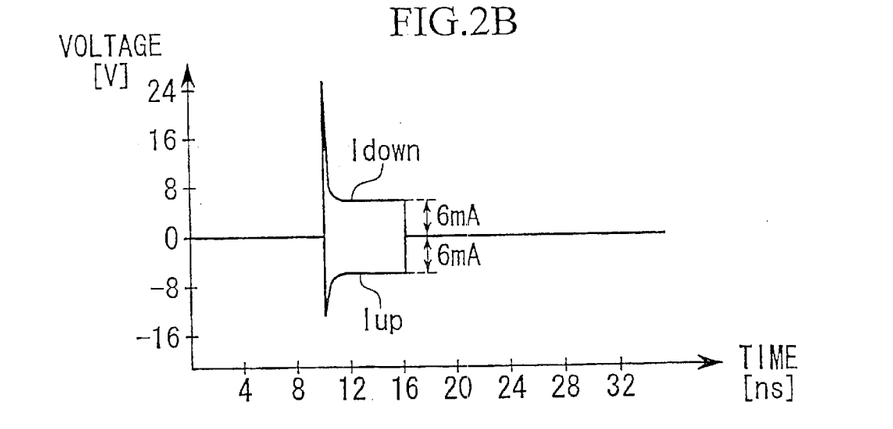
Figure 2C:
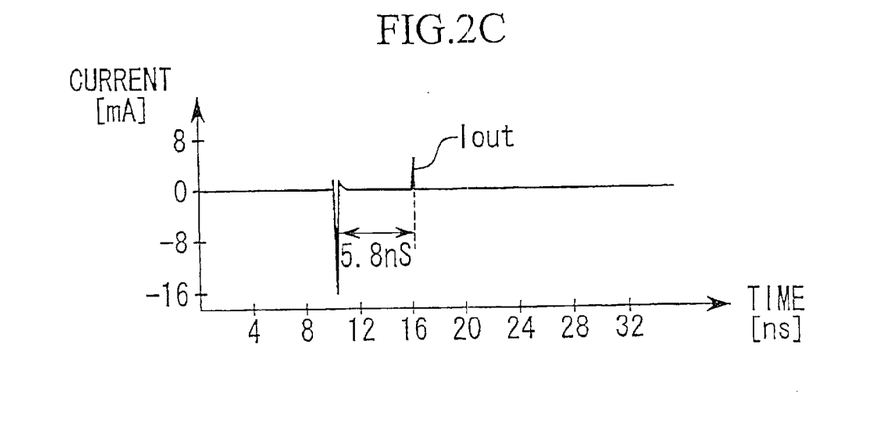

Here, FIGS. 2A to 2C show the operation of the charge pump circuit shown in FIG. 1 obtained by SPICE simulation. SPICE is a standard circuit analysis program, and is also a circuit simulator which carries out direct current analysis, alternating current analysis, transient analysis, Fourier analysis, and so on. As shown in FIG. 2A, times 10 ns to 15 ns are set for the phase comparison signals Eup and Edown as a dead band prevention period. Next, as shown in FIG. 2B, the rise time of the charge-down current Idown and the charge-up current Iup are shortened compared with those in FIG. 4B. In addition, the charge-down current Idown is obtained by monitoring the drain current of the n-type transistor M6. Similarly, the charge-up current Iup is obtained by monitoring the drain current of the p-type transistor M3. Moreover, regarding both currents, the direction of each current input into the drain of the respective transistors is treated as positive. Next, in this embodiment, as shown in FIG. 2C, the rise time of the charge pump current $I_{out}$ is 5.8 nanoseconds, which is shortened by about ¼ compared with that in FIG. 4C. In addition, regarding the charge pump current $I_{out}$, the direction of current output from the signal output terminal Cpout is treated as positive.

As described above, according to the present embodiment, both the rise time of the charge pump current and the dead band prevention period can be shortened, thus it is possible to reduce noise components such as switching noise and low frequency noise.

Additionally, the C/N ratio of the PLL circuit is improved by the adoption of the charge pump circuit mentioned above.

Although the present invention has been explained based on the preferred embodiment, the charge pump circuit and the PLL circuit according to the present invention are not limited only to the structure in the above-mentioned embodiment, and charge pump circuits and PLL circuits with various corrections and changes from the structure of the above-mentioned embodiment are also included in the range of the present invention.

What is claimed is:

1. A charge pump circuit comprising:

a first current mirror circuit through which a charge-up current flows; and a second current mirror circuit through which a charge-down current flows;

wherein a charge pump current corresponding to the difference between said charge-up current and said charge-down current is output as an output signal;

said first current mirror circuit comprises first and second current sources, and a first reference transistor which is connected to said first current source and generates a first reference potential in response to the activation of a first comparison signal, and is connected to said second current source and generates a second reference potential in response to the deactivation of said first comparison signal; and a first output transistor through which said charge-up current flows in response to application of said first reference potential, and which turns off in response to application of said second reference potential; and said second current mirror circuit comprises third and fourth current sources, and a second reference transistor which is connected to said third current source and generates a third reference potential in response to the activation of a second comparison signal, and is connected to said fourth current source and generates a fourth reference potential in response to the deactivation of said second comparison signal; and a second output transistor through which said charge-down current flows in response to application of said third reference potential, and which turns off in response to application of said fourth reference potential.

2. A charge pump circuit according to claim 1, wherein said first comparison signal is a signal showing a lagging phase, and said second comparison signal is a signal showing a leading phase.

3. A charge pump circuit according to claim 1, wherein said second reference potential is a potential which puts said first output transistor in a cutoff state that is nearly turned on.

4. A charge pump circuit according to claim 1, wherein said fourth reference potential is a potential which puts said second output transistor in a cutoff state that is nearly turned on.

5. A charge pump circuit according to claim 1, wherein the channel lengths and the channel widths of said first and second reference transistors and said first and second output transistors are set to a predetermined length and a predetermined width which are required to control the value of current passing through the source-drains path in the respective transistors.

6. A charge pump circuit according to claim 1, further comprising:

a first cutoff transistor which is connected to said first output transistor in series, and turns on in response to the activation of said first comparison signal, and which cuts off in response to the de activation of said first comparison signal; and a second cutoff transistor which is connected to said second output transistor in series, and turns on in response to the activation of said second comparison signal, and which cuts off in response to the deactivation of said second comparison signal.

7. A charge pump circuit according to claim 6, wherein the channel lengths of said first and second cutoff transistors are set to the minimum length that is allowed in a semiconductor process.

8. A charge pump circuit according to claim 6, wherein the channel widths of said first and second cutoff transistors are set to a predetermined width which are required to control the value of current passing through the source-drain paths in the respective transistors.

9. A charge pump circuit comprising:

a first reference current path comprising a first transistor and first and second current sources that are connected to said first transistor through respective first and second switches operated by a first input to the charge pump circuit;

a first output current path comprising a first output transistor and a first cutoff transistor connected in series to an output of the charge pump circuit, said first output transistor receiving a first potential from said first transistor when said first switch connects said first current source to said first transistor and a second potential from said first transistor when said second switch connects said second current source to said first transistor;

a second reference current path comprising a second transistor and a third current source that is connected to said second transistor through a third switch operated by a second input to the charge pump circuit; and a second output current path comprising a second output transistor and a second cutoff transistor connected in series to said output of the charge pump circuit, said second output transistor receiving a first potential from said second transistor when said third switch connects said third current source to said second transistor and a second potential from said second transistor when said second transistor is not connected to said third current source.

10. The charge pump circuit of claim 9, further comprising an inverter connected between said first input to the charge pump circuit and said first cutoff transistor, and wherein said first input to the charge pump circuit is connected to said first switch and said inverter is connected to said second switch.

11. The charge pump circuit of claim 9, wherein said second reference current path further comprises a fourth current source that is connected to said second transistor through a fourth switch operated by the second input to the charge pump circuit, and wherein said second output transistor receives a second potential from said second transistor when said fourth switch connects said fourth current source to said second transistor.

12. The charge pump circuit of claim 11, further comprising an inverter connected between said second input to the charge pump circuit and said third switch, and wherein said second input to the charge pump circuit is connected to said second cutoff transistor and to said fourth switch.

* * * * *